United States Patent [19]

Shibib

[11] Patent Number: 5,381,031
[45] Date of Patent: Jan. 10, 1995

[54] SEMICONDUCTOR DEVICE WITH REDUCED HIGH VOLTAGE TERMINATION AREA AND HIGH BREAKDOWN VOLTAGE

[75] Inventor: Muhammed A. Shibib, Wyomissing Hills, Pa.

[73] Assignee: AT&T Corp., Murray Hill, N.J.

[21] Appl. No.: 172,370

[22] Filed: Dec. 22, 1993

[51] Int. Cl.6 .................. H01L 23/58; H01L 29/76; H01L 29/94
[52] U.S. Cl. .................. 257/488; 257/337; 257/339; 257/341; 257/491
[58] Field of Search .............. 257/488, 489, 490, 491, 257/492, 493, 494, 495, 337, 339, 341, 409

[56] References Cited

U.S. PATENT DOCUMENTS

| | | | |
|---|---|---|---|
| 4,532,534 | 7/1985 | Ford et al. | 257/341 |
| 4,605,948 | 8/1986 | Martinelli | 357/34 |
| 5,270,568 | 12/1993 | Terashima | 257/488 |

Primary Examiner—Steven Ho Yin Loke

[57] ABSTRACT

A semiconductor device (12) with reduced high voltage termination area and high breakdown voltage. The device comprises first and second field shield plates (46), (48). The first field shield plate (46) is disposed above a high voltage first impurity region (22) and a junction extension doped region (42) and is in contact with a conductive material (26) which comprises the high voltage terminal of the device (12). A second field shield plate (48) is disposed above a low voltage second impurity region (30) and the junction extension doped region (42) and is covered by an extended portion (35) of a low voltage source contact (34).

5 Claims, 2 Drawing Sheets

SEMICONDUCTOR DEVICE WITH REDUCED HIGH VOLTAGE TERMINATION AREA AND HIGH BREAKDOWN VOLTAGE

BACKGROUND OF THE INVENTION

I. Field of the Invention

This invention pertains to semiconductor devices having improved high voltage junction terminations. More particularly, the present invention pertains to semiconductor devices having a reduced surface field and an improved high voltage junction termination for increasing the device breakdown voltage.

II. Background Art

Semiconductor devices having regions of alternate conductivity suffer breakdown when operated at high voltages. The specific voltage at breakdown is referred to as the breakdown voltage. For a given high voltage applied to a planar semiconductor device, the region of the device most susceptible to breakdown is located at the portions of the PN junctions located at the upper, major surface of the device, near the side walls and proximate the high voltage terminals. This region is most susceptible to breakdown because additional charges which accumulate on the upper, major surface result in a higher electric field at that region.

In an effort to reduce the threat of surface breakdown near a high voltage terminal in a semiconductor device, techniques have been developed to reduce the surface electric field that exists at the upper, major surface of the device between the high voltage and low voltage terminals. Such techniques are referred to as RESURF techniques and generally consist of diffusing a lightly doped region of semiconductor material between the high voltage doped region and the low voltage doped region so that the lateral diffused portions of the lightly doped region are in contact with the high and low voltage doped regions. This results in redistributing the surface electric field to reduce the strong variations of surface voltage that exist in the regions on the upper, major surface between the high and low voltage contacts. For example, for a PNP bipolar transistor with an N− substrate, having the base terminal operated at a high voltage and the collector terminal operated at a low voltage relative to the base terminal, the lightly doped P region (P−) is disposed between and in contact with the collector and base doped regions. This establishes a gradient or uniform distribution of the electric field that is present on the upper, major surface of the device thereby increasing the surface breakdown voltage.

Such a RESURF technique, as described above, is disclosed in U.S. Pat. No. 4,605,948 issued to Martinelli, which discloses an NPN bipolar transistor having a P− supplementary region disposed between and in contact with the high voltage and low voltage doped regions. A drawback of the Martinelli device is that the surface area along the upper, major surface, between the high and low voltage doped regions, i.e. the junction termination extension region, has a significant width (between 200–400 μm) and, therefore, occupies a substantial portion of the upper, major surface of the device. It is, therefore, desirable to have a high voltage semiconductor device with a high surface breakdown voltage and a reduced junction extension region.

Accordingly, it is an object of this invention to provide a semiconductor device having a reduced surface field for increasing the surface breakdown voltage.

Another object of the invention is to maintain a high breakdown voltage with a reduced junction extension region.

It is yet another object of the present invention to provide a semiconductor device having an increased surface breakdown voltage with a reduced junction termination extension region and having increased stability and reliability over prior art high voltage semiconductor devices which employ presently known RESURF techniques.

Other objects as well as additional details of the present invention will become apparent from the following detailed description and annexed drawings of the presently preferred embodiment thereof.

SUMMARY OF THE INVENTION

The present invention relates to a semiconductor device having a reduced high voltage termination area with a high breakdown voltage. The device comprises a first field shield plate disposed above an upper, major surface of the device between a high voltage first impurity region and a junction extension region. The first field shield plate serves to distribute the electric field that exists on the upper, major surface of the device between the high voltage impurity region and a low voltage impurity region, thereby increasing the breakdown voltage at the upper, major surface. In addition, the first field shield plate, in effect, extends the high voltage first impurity region in a direction toward the low voltage impurity region. Thus, the width of the junction extension region can be narrowed.

In a preferred embodiment, a second field shield plate is disposed above the upper, major surface of the device between the low voltage impurity region and the junction extension region to further distribute the electric field at the upper, major surface and to further narrow the width of the junction extension region.

In one embodiment, a device in accordance with the invention comprises a semiconductor substrate having an upper surface and being of a first electrical conductivity type with a first doping concentration. A bulk region of the first electrical conductivity type is disposed on the upper surface of the substrate and defines a side wall and a part of the upper, major surface of the device. The bulk region has a doping concentration less than the first doping concentration. A first impurity region contiguous with the bulk region, adjacent the side wall and defining a first portion of the upper, major surface is disposed in the bulk region. The first impurity region is of the first electrical conductivity type, has a doping concentration greater than the doping concentration of the bulk region and is in conductive relation with a first conducting material.

A second impurity region contiguous with the bulk region, spaced from the first impurity region and defining a second portion of the upper, major surface is disposed in the bulk region. The second impurity region is of a second electrical conductivity type and has a second doping concentration. A third impurity region contiguous with the bulk region between the first and second impurity regions, in contact with the second impurity region and defining a third portion of the upper, major surface between the first and second portions of the upper, major surface is also disposed in the bulk region. The third impurity region is of the second electrical conductivity type and has a doping concentration less than the doping concentration of the second impurity region. The second impurity region is in conductive relation with a second conducting material having a part thereof extending above the third portion of the upper, major surface and in spaced relation therefrom.

The device also comprises a first field shield plate which is in conductive relation with the first conducting material and in spaced relation from the upper, major surface above the first and third portions of the upper, major surface. Insulating material is disposed on the portions of the upper, major surface not in contact with the first and second conducting materials, and a third conducting material is in conductive relation with the semiconductor substrate.

In the preferred embodiment, the device further comprises a second field shield plate disposed above the second and third portions of the upper major surface.

BRIEF DESCRIPTION OF THE DRAWINGS

In the drawings, wherein like reference numerals denote like elements throughout the several views.

DETAILED DESCRIPTION OF THE PREFERRED EMBODIMENT

Figure 1:
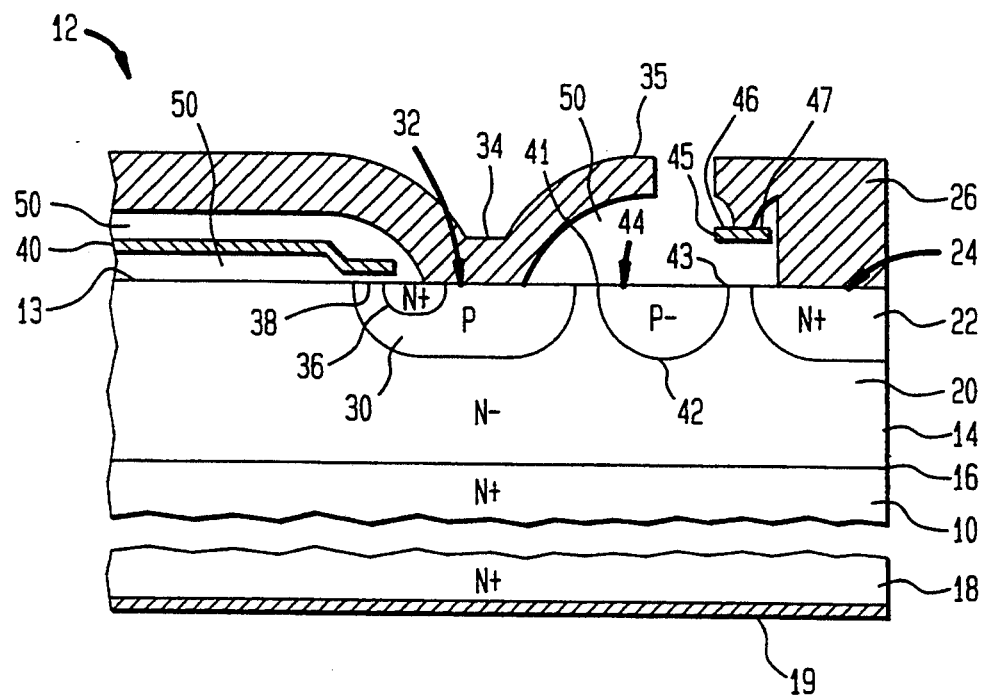
FIG. 1 is a sectional view of a vertical DMOS device in accordance with the present invention.

Referring now to the drawings and initially to FIG. 1, a portion of a semiconductor substrate containing an N-channel DMOS semiconductor device 12 is shown. The device 12 has an upper, major surface 13 and is comprised of a substrate 10, which is preferably N+ silicon material with a first doping concentration, having an upper surface 16 and a lower surface 18. The substrate 10 forms the drain region of the DMOS device and is in conductive relation with a third conducting material which forms a drain contact 19 disposed on lower surface 18. Upper surface 16 of substrate 10 has a bulk region 20 disposed thereon. Bulk region 20 is preferably comprised of silicon material having an N− doping concentration and a side wall 14. As shown, part of bulk region 20 defines a portion of upper, major surface 13.

The device 12 further comprises a first impurity region 22 of a semiconductor material having an N+ doping concentration which is formed, for example, by diffusion techniques as is known to those of ordinary skill in the art, so that the first impurity region 22 abuts side wall 14 and also defines a first portion 24 of upper, major surface 13. Disposed on upper, major surface 13 in conductive relation with the portion 24 of surface 13 is a first conductive material 26 for applying a voltage to first impurity region 22. As is known to those of ordinary skill in the art, when the device is in operation, a common high voltage is applied to drain contact 19 and first conducting material 26, thereby maintaining substrate 10 and first impurity region 22 at the same electric potential. In effect, conducting material 26 forms a supplemental drain contact of the device 12.

Device 12 also comprises a first field shield plate 46 having an inner edge 45, an outer edge 47 and upper and lower surfaces. As shown, the upper surface of the shield plate 46 is in region-to-region contact with conducting material 26 and, thus, is likewise maintained at a high voltage. The first field shield plate 46 is positioned above the surface 13 in a manner more fully described below.

As shown, device 12 has a second impurity region 30, preferably comprised of P-type silicon material having a second doping concentration and formed by diffusion techniques, extending from upper, major surface 13 into bulk region 20. A source region 36 is confined within second impurity region 30. As the described device is an N-channel DMOS, the source region 36 comprises a heavily doped N-type semiconductor material (N+). As is known in the art, second impurity region 30 defines a channel 38 in conductive relation with a gate contact 40 which, during operation, has a gate voltage applied thereto for regulating current flow through device 12. The second impurity region 30 defines a second portion 32 of the upper, major surface 13 in contact with a second conducting material forming a source contact 34 having an extended portion 35. In the preferred embodiment, the gate contact 40 is comprised of polycrystalline silicon (polysilicon), and the source contact 34, conducting material 26 and drain contact 19 are comprised of metal, most preferably aluminum.

Figure 3:
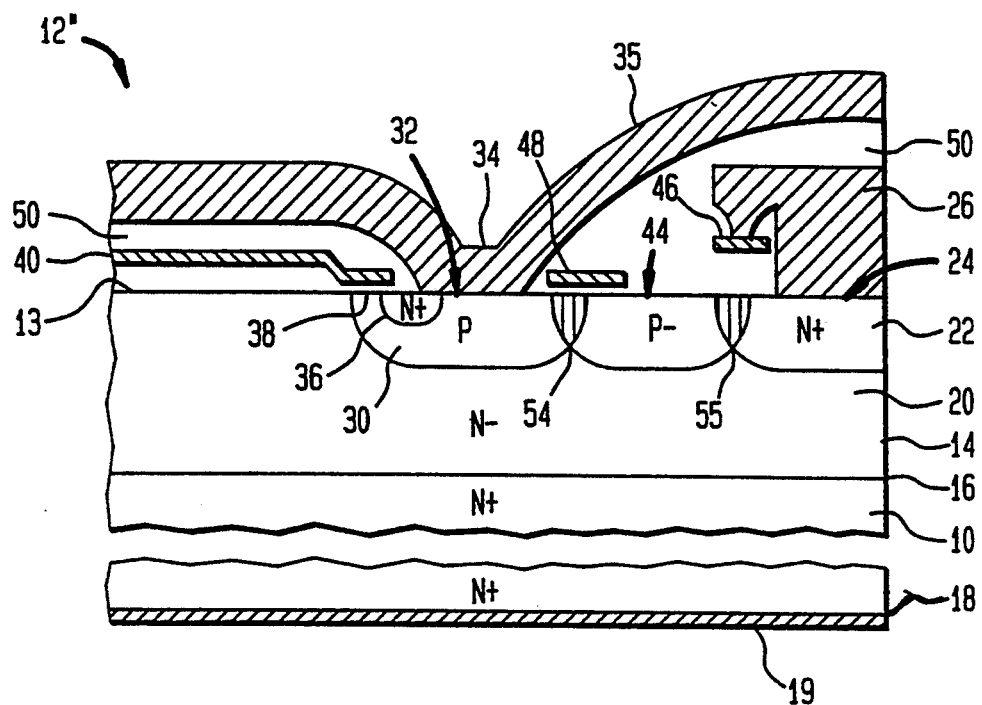
FIG. 3 is a sectional view of a vertical DMOS device showing still another preferred embodiment of the present invention.

With reference still to FIG. 1, the device 12 has a third impurity region 42 defining a junction termination extension region, which is formed between the first and second impurity regions 22, 30 and has inner and outer edges 41, 43, respectively. The third impurity region 42 is preferably in contact with the second impurity region 30, as shown in FIG. 3 and defines a third portion 44 of the upper, major surface 13 and is of a lightly doped P semiconductor material, such as a P− silicon material. The inner edge 41 of extension region 42 at the surface 13 is disposed below the extended portion 35 of the source contact 34 and the outer edge 43 at the surface 13 is disposed below the first field shield plate 46. Thus, as shown, first field shield plate 46 extends over both the first and third portions 24, 44 of the upper, major surface 13.

As is typical, the device 12 includes several insulated areas 50 comprised of an insulating material such as, for example, silicon dioxide ($SiO_2$), for insulating source contact 34, drain contacts 26, 19 and first field shield plate 46 as necessary. The first field shield plate 46 is separated from upper, major surface 13 by insulating material 50 having a thickness of approximately 1 μm. As is known in the art, although gate contact 40 is separated from the second portion 32 of surface 13 by a layer of insulating material 50, this insulating layer is relatively thin (preferably 0.1 μm). Thus, when the appropriate turn-on voltage is applied to gate contact 40, a channel will be formed in channel region 38.

As should be now apparent, since first field shield plate 46 is connected to and therefore at the same electric potential as drain contact 26, when device 12 is active the high electric field present at the first portion 24 of upper, major surface 13 will be distributed over the junction termination extension region 42. This provides a two-fold benefit. First, it reduces the electric field between the first and third portions 24, 44 of the surface 13. Secondly, it allows the width of the junction extension region 42, i.e. the distance between inner edge 41 and outer edge 43, to be narrowed. This is so because first field shield plate 46, in effect, extends the first impurity region 22 in a direction toward the second impurity region 30. Thus, junction extension region 42 is now positioned such that at least a portion of the junction extension region (the outer edge 43) is disposed below the first field shield plate 46. Consequently, a semiconductor device configured in accordance with the present invention increases the surface breakdown voltage while maintaining a relatively narrow junction termination extension region 42.

Figure 2:
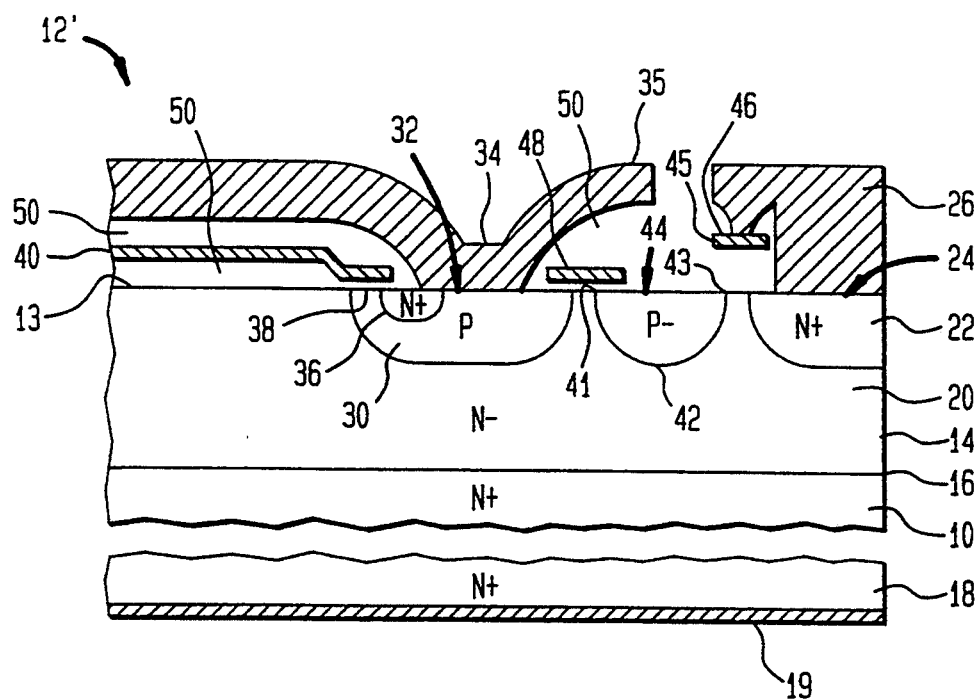
FIG. 2 is a sectional view of a vertical DMOS device showing another preferred embodiment of the present invention.

Referring now to FIG. 2, an N-channel DMOS device 12' is shown which is in all respects similar to the device 12 of FIG. 1 except for the inclusion of a second field shield plate 48. As shown, second field shield plate 48 has an inner edge positioned over the second portion 32 of upper, major surface 13 (i.e. over second impurity region 30) and an outer edge positioned over the third portion 44 or upper, major surface 13 (i.e. over the junction termination extension region 42). As the described device is a DMOS, second field shield plate 48 preferably comprises a part of gate contact 40 and, like gate contact 40, is separated from surface 13 by a layer of insulating material 50 having a thickness of approximately 0.1 μm.

The second field shield plate 48 further reduces the electric field above the second and third portions 32, 44, respectively, of the upper, major surface 13. When field shield plates 46 and 48 are positioned in the manner shown in FIG. 2, an electric field gradient is created on upper, major surface 13, extending from the high voltage contact 26 to the low voltage source contact 34. Thus, the electric field at the surface is further reduced, thereby further increasing the surface breakdown voltage as compared with the embodiment of FIG. 1. In addition, as second field shield plate 48, in effect, extends the low voltage second impurity region 30 along upper, major surface 13, the width of the junction extension region 42 can be further narrowed.

Referring now to FIG. 3, a most preferred embodiment of an N-channel DMOS device 12" in accordance with the present invention is shown. The device 12" is in all respects identical to the device 12' of FIG. 2, except as noted below. In the device 12" of FIG. 3 the extended portion 35 of source contact 34 extends to side wall 14 and is isolated (via insulation 50) from and overlaps the high voltage contact 26 such that third portion 44 of upper, major surface 13 as well as contact 26 are covered by extended region 35. This additional feature completely electrostatically shields the covered regions from charges on the surface of the source contact 34 and high voltage contact 26 which charges might otherwise degrade the device's long term reliability.

Still referring to FIG. 3, junction termination extension region 42 is shown having lateral diffused portions extending into first and second impurity regions 22, 30, thereby forming regions of overlap 54 and 55. By thus forming the junction extension region 42, a uniform distribution of the electric field that exists directly below upper, major surface 13 between the first and second impurity regions 22, 30 is created which further increases the stability of the device 12". In other words, not only is the electric field evenly distributed above major surface 13 between the high and low voltage terminals, but it is also evenly distributed below surface 13. This further increases surface breakdown voltage as compared with the devices in FIGS. 1 and 2.

In the preferred embodiments, the second impurity region 30 is diffused to a depth of approximately 4 μm and the extension region 42 is diffused to a depth of approximately 6 μm. In the device 12" of FIG. 3, extension region 42 is diffused in an appropriate manner so that the depth of overlap region 54 equals the depth of second impurity region 30, i.e. approximately 4 μm.

As is known in the art, the surface breakdown voltage of planar semiconductor devices, such as the N-channel DMOS devices described above, is related to the doping concentration of the bulk region 20, as is the on-resistance of the device. Thus, if a semiconductor material having a high doping concentration is used for the bulk region 20 (i.e. a low resistivity material) a lower on-resistance will result, which is desirable in many applications. However, if such a high doping concentration material is used, the breakdown voltage of the device will be lowered due to the increased concentration of carriers. This, of course, is undesirable for high voltage devices. Applying this relationship to the present invention, if a device having a 300 volt breakdown voltage is desired and the device incorporates the high voltage junction termination scheme of the present invention, the doping concentration of the bulk region 20 can be increased over what it would have been in a device based on prior art RESURF techniques. In addition, and as explained above, increasing the doping concentration of the bulk region will also lower the on-resistance of the device. Thus, a device utilizing the present invention and having the same breakdown voltage as a prior art device will allow for a higher doping concentration in bulk region 20, thereby lowering the on-resistance of the device.

Although I have herein shown and described the currently preferred embodiment of the invention, various changes and modifications will be readily apparent to those of ordinary skill in the art who read the foregoing description. For example, while the foregoing description focused on a silicon DMOS device, the present invention can be equally applied to the junction terminations of other planar high voltage semiconductor devices having a high and low voltage terminals disposed along a common surface, such as, NPN and PNP transistors, insulated gate bipolar transistors (IGBTs), and diodes. In addition, opposite conductivity semiconductor devices can be constructed by simply interchanging the P doped semiconductor regions with N doped semiconductor regions. Thus, the preferred embodiments and examples described herein are for illustrative purposes only and are not to be construed as limiting the scope of the present invention, which is properly delineated only in the appended claims.

What is claimed is:

1. A semiconductor device defining an upper, major surface having a reduced high voltage termination area and high breakdown voltage, comprising:

a semiconductor substrate having an upper surface, said substrate being of a first electrical conductivity type and having a first doping concentration;

a bulk region of said first electrical conductivity type disposed on said upper surface of said substrate, said bulk region defining a side wall and a part of said upper, major surface, and having a doping concentration less than said first doping concentration;

a first impurity region contiguous with said bulk region adjacent said side wall and defining a first portion of said upper, major surface, said first impurity region being of said first electrical conductivity type and having a doping concentration greater than said doping concentration of said bulk region;

a first conducting material in conductive relation with said first portion of said upper, major surface;

a second impurity region contiguous with said bulk region, spaced from said first impurity region and defining a second portion of said upper, major surface, said second impurity region being of a second electrical conductivity type and having a second doping concentration;

a third impurity region contiguous with said bulk region between said first and second impurity regions, in region-to-region contact with said second impurity region and defining a third portion of said upper, major surface between said first and second portions of said upper, major surface, said third impurity region being of said second electrical conductivity type and having a doping concentration less than said second doping concentration of said second impurity region;

a second conducting material in conductive relation with said second portion of said upper, major surface, a part of said second conducting material extending directly above said third portion of said upper, major surface in spaced relation therefrom;

a first field shield plate in contact with said first conducting material and in spaced relation from said upper, major surface directly above said first and third impurity regions, said first field shield plate being electrically isolated from the second conducting material;

insulating material disposed on the portions of said upper, major surface not in contact with said first and second conducting materials; and a third conducting material in conductive relation with said semiconductor substrate.

2. The device of claim 1, further comprising a second field shield plate in spaced relation from said upper, major surface directly above said second and third portions of said upper, major surface.

3. The device of claim 2, wherein said part of said second conducting material extending above said third portion of said upper, major surface in spaced relation therefrom further extends above and in spaced relation from said first field shield plate.

4. The device of claim 3, wherein said third impurity region is in region-to-region contact with said first impurity region.

5. The device of claim 2, wherein said third impurity region is in region-to-region contact with said first impurity region.

* * * * *